United States Patent
Taniguro

(10) Patent No.: US 9,149,883 B2
(45) Date of Patent: Oct. 6, 2015

(54) SOLDERING DEVICE, SOLDERING METHOD, AND SUBSTRATE AND ELECTRONIC COMPONENT PRODUCED BY THE SOLDERING DEVICE OR THE SOLDERING METHOD

(75) Inventor: Katsumori Taniguro, Tochigi (JP)

(73) Assignee: TANIGUROGUMI CORPORATION, Nasushiobara-shi, Tochigi (JP)

( * ) Notice: Subject to any disclaimer, the term of this patent is extended or adjusted under 35 U.S.C. 154(b) by 270 days.

(21) Appl. No.: 13/819,555

(22) PCT Filed: Apr. 14, 2012

(86) PCT No.: PCT/JP2012/060191
§ 371 (c)(1),
(2), (4) Date: Feb. 27, 2013

(87) PCT Pub. No.: WO2013/153674
PCT Pub. Date: Oct. 7, 2013

(65) Prior Publication Data
US 2013/0269984 A1    Oct. 17, 2013

(51) Int. Cl.
  *B23K 31/02* (2006.01)
  *B23K 3/06* (2006.01)
  *H05K 1/02* (2006.01)
  *B23K 1/00* (2006.01)
  *B23K 1/20* (2006.01)

(52) U.S. Cl.
  CPC ............ *B23K 3/0607* (2013.01); *B23K 1/0016* (2013.01); *B23K 1/20* (2013.01); *B23K 3/0692* (2013.01); *H05K 1/0296* (2013.01)

(58) Field of Classification Search
  None
  See application file for complete search history.

(56) References Cited

U.S. PATENT DOCUMENTS

| 6,220,501 | B1 | | 4/2001 | Tadauchi et al. |
| 7,059,512 | B2 | * | 6/2006 | Arita et al. ................... 228/254 |
| 8,138,576 | B2 | * | 3/2012 | Ishikawa et al. ............. 257/612 |
| 2003/0168499 | A1 | * | 9/2003 | Tanabe et al. ................. 228/260 |
| 2008/0073414 | A1 | * | 3/2008 | Saito et al. .................... 228/244 |
| 2011/0079633 | A1 | * | 4/2011 | Ishikawa et al. ............. 228/260 |

FOREIGN PATENT DOCUMENTS

| JP | 10-286936 | | 10/1998 |
| JP | 11-114667 | | 4/1999 |
| JP | 4375491 | B1 * | 12/2009 |
| JP | 2011-114334 | | 6/2011 |
| JP | 2011-211137 | | 10/2011 |
| WO | WO 2011018861 | A1 * | 2/2011 |

* cited by examiner

*Primary Examiner* — Kiley Stoner
(74) *Attorney, Agent, or Firm* — Drinker Biddle & Reath LLP

(57) ABSTRACT

Provided are a soldering device and a soldering method which allow for soldering at low cost with high yield and high reliability. The soldering device has: first organic fatty acid-containing solution bath 21 in which workpiece member 10 having a copper electrode is immersed in organic fatty acid-containing solution 31*a*; space section 24 having a steam atmosphere of organic fatty acid-containing solution 31*b*, the space section horizontally having ejection unit 33 to spray a jet stream of a molten solder to the copper electrode provided on workpiece member 10 and ejection unit 34 to spray a liquid to an excess of the molten solder for removal; and second organic fatty acid-containing solution bath 23 in which workpiece member 10 from which the excess of the molten solder is removed in space section 24 is immersed again in organic fatty acid-containing solution 31*c*.

9 Claims, 15 Drawing Sheets

Solder Sn·3Ag·0.5Cu

Solder Sn·3Ag·0.5Cu
·0.05Ni·0.005Ge

40

6 5 4 2    41    2 4 5 6

40

SOLDERING DEVICE, SOLDERING METHOD, AND SUBSTRATE AND ELECTRONIC COMPONENT PRODUCED BY THE SOLDERING DEVICE OR THE SOLDERING METHOD

FIELD OF THE INVENTION

The present invention relates to a soldering device and a soldering method, as well as to a substrate and an electronic component that are produced by the device or the method. More particularly, the invention relates to a device and a method for soldering, which allow for soldering at low cost with high yield and high reliability, as well as to a substrate and an electronic component that are produced by the device and the method.

BACKGROUND ART

In recent years, wiring density and mounting density on substrates such as printed circuit boards, wafers, and flexible substrates (which may be hereinafter referred to as "mounting substrates") have been further improved. The mounting substrate has many copper electrodes for soldering electronic components. On the copper electrodes are formed solder bumps, to which the electronic components are soldered in order to be mounted on the mounting substrate.

Solder bumps are in micro-size and uniform in shape, size, and the like. It is required that solder bumps be formed only at necessary portions. As a solder bump formation method satisfying such a requirement, Patent Document 1 has proposed a technique and the like for easily forming minute and uniform bumps by using a screen plate provided with openings for forming paste bumps with a paste and characterized in that it includes a rigid first metal layer, a resin-based adhesive layer, and a second metal layer, and the openings of the adhesive layer and the second layer have a smaller diameter than that of the opening of the first metal layer.

Meanwhile, in an electronic component such as a connector, a QFP (Quad Flat Package), an SOP (Small Outline Package), or a BGA (Ball Grid Array), sizes of connecting terminals, such as lead terminals, can vary. To solder electronic components with connection terminals having varied sizes without any soldering failure, it is necessary to reduce the influence of size variation in the electronic components by increasing the thickness of solder bumps formed on a mounting substrate. When a compact electronic component such as a CSP (Chip Size Package) is among electronic components mounted on a mounting substrate, the size of a solder bump for such a compact electronic component is very small and minute.

As a typical method for forming a solder bump, there is known a method of directly dipping (immersing) a mounting substrate provided with copper electrodes in a molten solder. However, when solder comes into contact with a copper electrode, the copper combines with tin contained in the solder in order to produce a Cu—Sn intermetallic compound. The Cu—Sn intermetallic compound is formed in a manner that the copper electrodes are corroded by the tin in the solder, which is thus sometimes called "copper corrosion", "copper erosion", or the like (hereinafter referred to as "copper corrosion"). Such copper corrosion can reduce reliability on copper electrodes as electrical joints and thereby can deteriorate reliability on a mounting substrate. Accordingly, it is necessary to shorten the time for dipping a mounting substrate in a molten solder in order to suppress copper corrosion. Therefore, there has been considered a method (a dipping method) in which a spare solder layer is formed on copper electrodes on a mounting substrate and then the mounting substrate is dipped in a molten solder.

PRIOR ART REFERENCES

Patent Documents

Patent Document 1: Japanese Laid-Open Patent Application No. 1998-286936

SUMMARY OF THE INVENTION

The Problems Solved by the Invention

Of the methods for forming a solder bump described above, the method for forming a solder bump using a screen plate has a problem of poor productivity. Further, the method for forming a solder bump by the dipping method causes a difference in copper corrosion between a first dipping (immersing) portion and a final dipping portion, thereby causing a difference in reliability on copper electrodes between respective portions of the same substrate. Therefore, the problem of copper corrosion has not been able to be solved yet.

The present invention has been accomplished to solve the above problems. It is an object of the present invention to provide a soldering device and a soldering method that allow for soldering at low cost, with high yield and high reliability. In addition, it is another object of the present invention to provide a substrate and an electronic component produced by the soldering device or the soldering method.

Problem Resolution Means (1) To solve the above-discussed problems, the soldering device according to the present invention has: a first organic fatty acid-containing solution bath in which a workpiece member having a copper electrode is immersed in an organic fatty acid-containing solution; a space section having a steam atmosphere of an organic fatty acid-containing solution that is the same or roughly the same as the organic fatty acid-containing solution, the space section horizontally comprising an ejection unit to spray a jet stream of a molten solder to the copper electrode provided on the workpiece member and an ejection unit to spray a liquid to an excess of the molten solder for removal; and a second organic fatty acid-containing solution bath in which the workpiece member from which the excess of the molten solder is removed in the space section is immersed again in the organic fatty acid-containing solution.

In the soldering device according to the present invention, (a1) the organic fatty acid-containing solution is preferably a palmitic acid-containing solution, (b1) the molten solder is preferably a molten solder processed with the organic fatty acid-containing solution, (c1) the liquid for removing the excess of the molten solder is preferably the organic fatty acid-containing solution, (d1) after the processing in the second organic fatty acid-containing solution bath, the soldering device preferably has an ejection unit that drains off the organic fatty acid-containing solution adhered to a surface of the workpiece member, and (e1) temperatures of the first organic fatty acid-containing solution bath and the second organic fatty acid-containing solution bath are preferably lower than a temperature of the space section, and the temperature of the space section is preferably the same as or higher than a temperature of the molten solder sprayed in the space section.

In the soldering device according to the present invention, (f1) a tray that collects the molten solder sprayed to the workpiece member for reuse is preferably provided below the ejection unit in the space section. Further, in the soldering device according to the present invention, (g1) a circulation device preferably provides the molten solder deposited at the bottom of the organic fatty acid-containing solution below the ejection unit to the ejection unit for spraying the molten solder.

(2) To solve the above-discussed problems, the soldering method according to the present invention includes: an immersion step of immersing a workpiece member having a copper electrode in an organic fatty acid-containing solution; a spraying step of spraying an jet stream of a molten solder to the copper electrode provided on the workpiece member in a space section having a steam atmosphere of an organic fatty acid-containing solution that is the same or roughly the same as the organic fatty acid-containing solution, after the immersion step; a transferring step of horizontally transferring the workpiece member after the spraying step and spraying a liquid to an excess molten solder of the sprayed molten solder for removal; and a re-immersing step of immersing the workpiece member from which the excess molten solder is removed in the transferring step, again in an organic fatty acid-containing solution.

In the soldering method according to the present invention, (a2) the organic fatty acid-containing solution is preferably a palmitic acid-containing solution, (b2) the molten solder is preferably a molten solder processed with the organic fatty acid-containing solution, (c2) the liquid for removing the excess of the molten solder is preferably the organic fatty acid-containing solution, (d2) after the processing in the second organic fatty acid-containing solution bath, the soldering device preferably has an ejection unit that drains off the organic fatty acid-containing solution adhered to a surface of the workpiece member, and (e2) temperatures of the first organic fatty acid-containing solution bath and the second organic fatty acid-containing solution bath are preferably lower than a temperature of the space section, and the temperature of the space section is preferably the same as or higher than a temperature of the molten solder sprayed in the space section.

In the soldering device according to the present invention, (f2) the molten solder sprayed to the workpiece member is preferably collected for reuse. Further, in the soldering device according to the present invention, (g2) the molten solder deposited at the bottom of the organic fatty acid-containing solution is provided below the ejection unit to the ejection unit for spraying the molten solder.

(3) To solve the above-discussed problems, the substrate according to the present invention is produced by the soldering device or the soldering method, and has a copper electrode on which a copper corrosion prevention layer, a solder layer, and an organic fatty acid coating layer are provided in this order from a surface of the copper electrode.

(4) To solve the above-discussed problems, the electronic component according to the present invention is produced by the soldering device or the soldering method, and has a copper electrode on which a copper corrosion prevention layer, a solder layer, and an organic fatty acid coating layer are provided in this order from a surface of the copper electrode.

Efficacy of the Invention

The soldering device and the soldering method according to the present invention continuously perform immersion processing in a first organic fatty acid-containing solution, ejection processing of a molten solder in a space section, removal processing of an excess of the molten solder performed by horizontal transfer in the space section, and immersion processing in a second organic fatty acid-containing solution. Accordingly, there can be produced a substrate and an electronic component in which there occur neither copper corrosion of copper electrodes, as occurring in conventional dipping processing, nor copper corrosion in subsequent various mounting steps. As a result, a substrate and an electronic component having highly reliable copper electrodes as electrical joints and having high yield can be produced at low cost.

Particularly, after immersion in an organic fatty acid-containing solution, in the space having a steam atmosphere of an organic fatty acid-containing solution that is the same or roughly the same as the organic fatty acid-containing solution, the jet stream of a molten solder is sprayed to copper electrodes formed on a workpiece member, and then, after horizontally transferring the member in the space, a liquid is sprayed to an excess of the molten solder for removal. Thus, on the cleaned copper electrode surfaces, a copper corrosion prevention layer is uniformly formed without any defect, and furthermore, the member is immersed again in an organic fatty acid-containing solution in the state in which the excess molten solder has been removed, so as to provide an organic fatty acid coating layer. As a result, in the state in which a minimum solder layer is provided on the copper corrosion prevention layer, there is provided the organic fatty acid coating layer maintaining solder wettability of the solder layer. Thus, in subsequent mounting steps, even when the member is dipped in various molten solder baths, fed in a reflow furnace after printing of paste solder, or fed in a combustion furnace, copper corrosion of the copper electrodes does not occur, without deteriorating the solder wettability, and the member can be processed at the subsequent mounting steps.

In the substrate and the electronic component according to the present invention, on copper electrodes of the substrate and the electronic component, a copper corrosion prevention layer, a solder layer, and an organic fatty acid coating layer are provided in this order from the surfaces thereof. Thus, even when heat is applied in a reflow furnace, a combustion furnace or the like after that, the copper corrosion prevention layer blocks corrosion of the copper electrodes. As a result of that, in mounting steps of an electronic component performed through various steps, there is no reduction in reliability on electrical joints (copper electrode portions) and high yield production can be achieved. Therefore, a substrate and an electronic component that are highly reliable can be provided at low cost.

BRIEF DESCRIPTIONS OF THE DRAWINGS

FIG. 8A is a schematic cross-sectional view of a copper electrode portion formed in a Comparative Example and FIG. 8B is a schematic cross-sectional view of a copper electrode portion formed in an Example.

FIGS. 12A and 12B are results of the Comparative Example, and FIGS. 12C and 12D are results of the Example.

EMBODIMENTS OF THE INVENTION

Hereinafter, a description will be given of a soldering device and a soldering method according to the present invention, as well as a substrate and an electronic component that are produced by the soldering device and the soldering method according to the present invention, with reference to the drawings. In the present application, the term "the present invention" can be said in other words as "embodiment of the present invention". In addition, the term "copper corrosion prevention layer" means a layer serving to prevent the corrosion of a copper electrode (which means a situation in which copper atoms diffuse and elute) due to solder.

[Soldering Apparatus and Soldering Method]

Figure 1:
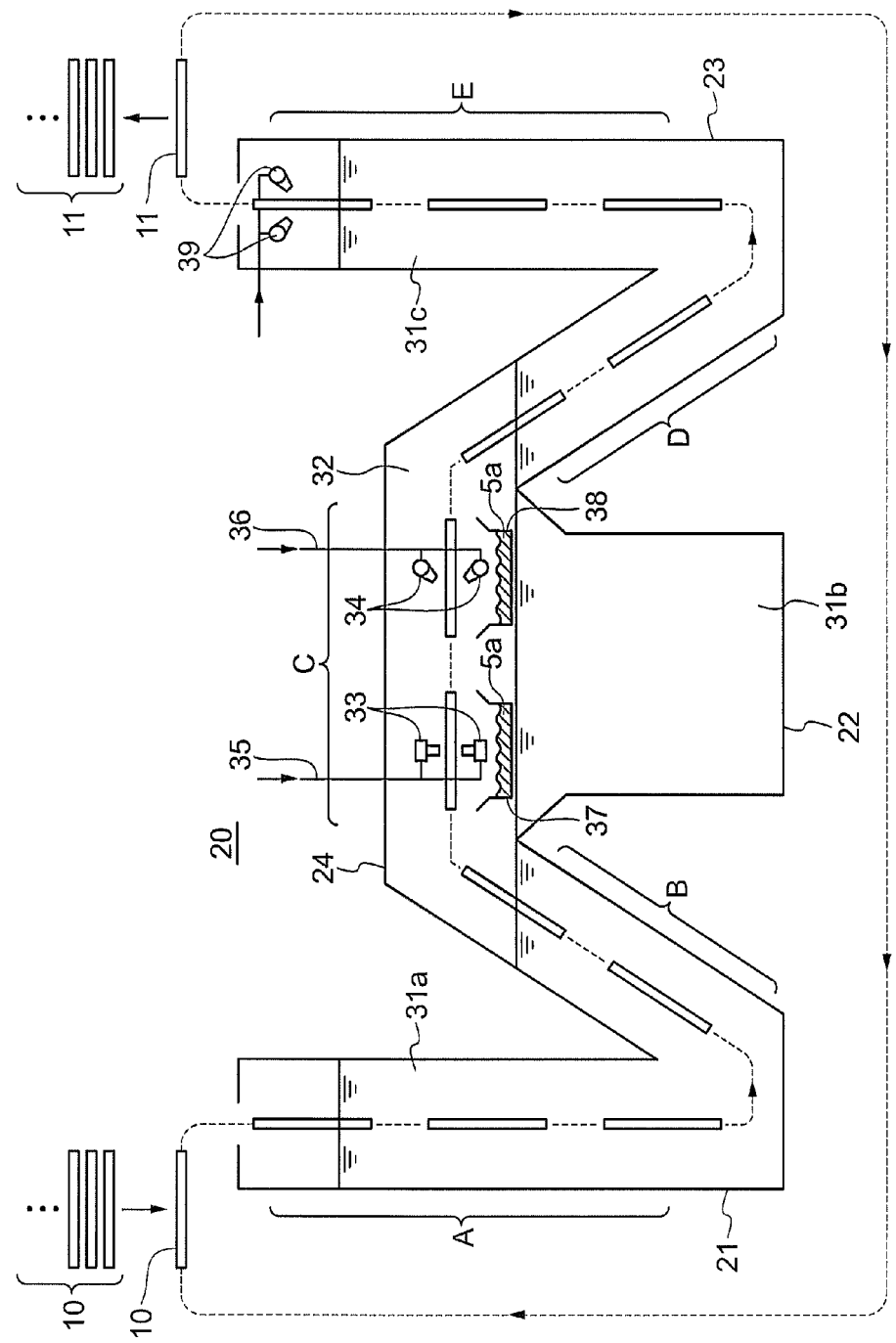
FIG. 1 is a schematic structural view illustrating one example of a soldering device according to the present invention.
Figure 5:
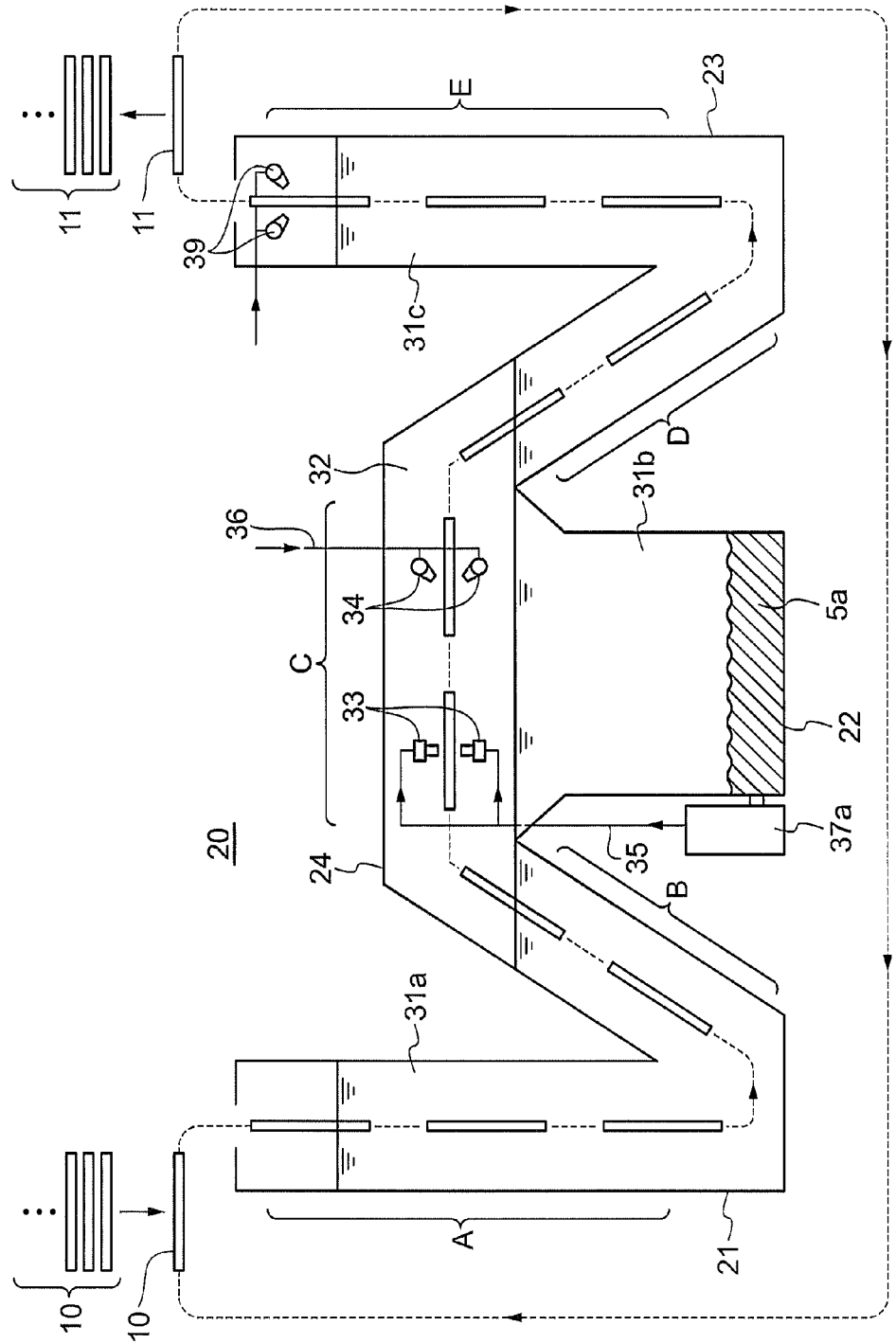
FIG. 5 is a schematic cross-sectional view illustrating another example of the soldering device according to the present invention.

Soldering device 20 and a soldering method according to the present invention are, as shown in FIG. 1 and FIG. 5, an device and a method continuously performing immersion processing in first organic fatty acid-containing solution 31a, ejection processing of molten solder 5a in space section 24, removal processing of an excess of molten solder 5a by horizontal transfer in the space section 24, and immersion processing in second organic fatty acid-containing solution 31c. By such soldering device 20 and such a soldering method, there can be produced a substrate and an electronic component in which there occurs no copper corrosion of copper electrodes, as occurring in conventional dipping processing, as well as no copper corrosion occurs in subsequent various mounting steps. As a result, there can be produced a substrate and an electronic component having high reliability on copper electrodes as electrical joints and achieving high yield at low cost.

Hereinafter, a detailed description will be given of each structure and each step of the device.

(Workpiece Member)

Workpiece member 10 is used to soldering device 20 and the soldering method. Specific examples of workpiece member 10 include substrates (which may also be referred to as "mounting substrates"), such as a printed circuit board, a wafer, and a flexible substrate, and electronic components such as a connector, a QFP (Quad Flat Package), an SOP (Small Outline Package), a BGA (Ball Grid Array), a semiconductor chip, a chip resistor, a chip capacitor, and a jumper wire. In addition, the examples thereof also include known substrates and electronic components other than those exemplified herein, and new substrates and electronic components that will be developed in the future.

Workpiece member 10 is provided with copper electrode 2. Soldering device 20 and the soldering method according to the present invention are an device and a method applied upon soldering to such copper electrode 2.

Figure 9:
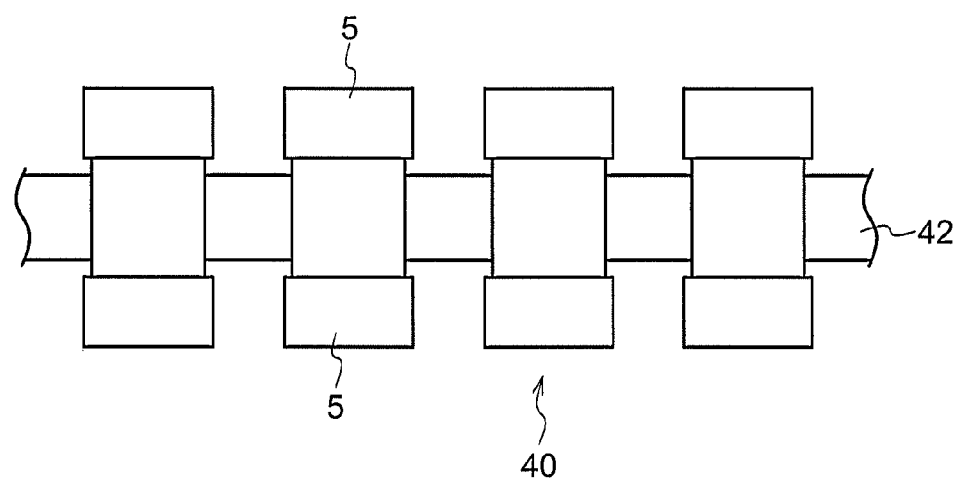
FIG. 9 is a schematic view illustrating one example of an electronic component that has been subjected to continuous processing while being supported by a support jig.

Such workpiece member 10 is conveyed continuously in soldering device 20, for example, by a belt conveyor which is illustrated by a loop with dotted lines and the arrows in FIG. 1 and FIG. 5. As a fixing jig for fixing workpiece member 10 to the belt conveyor upon conveyance thereof by the belt conveyor, there may be used various kinds of jigs along a shape of workpiece member 10 conveyed. For example, in a case of a printed circuit board shown in FIG. 2, a frame-shaped jig (not shown) supporting by enclosing the rectangular printed circuit board by a rim thereof may be arbitrarily used. For example, in a case of electronic component 40 shown in FIG. 9, support jig 42 corresponding to a shape of electronic component 40 may be arbitrarily used.

(Immersion Processing in First Organic Fatty Acid-Containing Solution)

Workpiece member 10 is fed in first organic fatty acid-containing solution bath 21 in feeding section A of FIG. 1 and FIG. 5. First organic fatty acid-containing solution bath 21 is filled with a predetermined amount of first organic fatty acid-containing solution 31a. The size and shape of first organic fatty acid-containing solution bath 21 are not specifically limited. However, preferably, first organic fatty acid-containing solution bath 21 has a size and a shape that are sufficient to allow for immersion of workpiece member 10 in first organic fatty acid-containing solution 31a, as well as that do not hinder continuous conveyance of workpiece member 10. In examples of FIG. 1 and FIG. 5, first organic fatty acid-containing solution bath 21 is composed of feeding section A having a rectangular or cylindrical water tank structure extending vertically from upward to downward and preheating section B disposed continuously from feeding section A and having a rectangular or cylindrical water tank structure extending from downward to diagonally upward. Obviously, the configurations of feeding section A and preheating section B are not limited thereto.

As exemplified in FIG. 1 and FIG. 5, feeding section A is the rectangular or cylindrical water tank structure extending vertically from upward to downward. In this feeding section A, organic fatty acid-containing solution 31a in first organic fatty acid-containing solution bath 21 is not at so high temperature, and is preferably controlled to be at a temperature of, for example, about 30° C. to 100° C. As a controlling means for that, a heater or a condenser tube may be wound around the circumference of feeding section A for the control or a heater or a condenser tube may be inserted in feeding section A for the control. A preferable temperature thereof is about 30° C. to 70° C. Setting the temperature of organic fatty acid-containing solution 31a within such a not too-high temperature range can suppress evaporation of the solution, as well as can prevent the occurrence of defects or the like due to thermal expansion when workpiece member 10 at room temperature is suddenly fed in organic fatty acid-containing solution 31a at high temperature.

As exemplified in FIG. 1 and FIG. 5, preheating section B is the rectangular or cylindrical water tank structure extending diagonally from downward to upward. In this preheating section B, organic fatty acid-containing solution 31a in first organic fatty acid-containing solution bath 21 is at relatively high temperature, and preferably is controlled to be at a temperature of for example, about 100° C. to 240° C. As a controlling means for that, a heater or a condenser may be wound around the circumference of the bath of preheating section B for the control, or a heater or a condenser tube may be inserted in the bath of preheating section B for the control. A preferable temperature of the solution is about 140° C. to 220° C. Setting the temperature of organic fatty acid-containing solution 31a in such a temperature range can prevent the occurrence of defects or the like due to sudden thermal expansion or the like when workpiece member 10 is fed in space section 24 controlled to a temperature atmosphere of around about 250° C. In this preheating section B, the bath is continued to space section 24, so that there is an advantage that the evaporation of organic fatty acid-containing solution 31a is no consideration.

Organic fatty acid-containing solution 31a is contained in first organic fatty acid-containing solution bath 21. Organic fatty acid-containing solution 31a is preferably a solution containing an organic fatty acid having 12 to 20 carbon atoms. Even if the solution contains an organic fatty acid having 11 or lower carbon atoms, it is usable. However, such an organic fatty acid is water absorbent and thus not very preferable when used, for example, in the temperature range of 100° C. to 240° C. controlled by preheating section B. In addition, organic fatty acids having 21 or more carbon atoms have problems, such as high melting point, poor permeability, and difficult handling. As a typical one, preferred is palmitic acid having 16 carbon atoms. It is particularly preferable to use only palmitic acid having 16 carbon atoms as the organic fatty acid, and as needed, an organic fatty acid having 12 to 20 carbon atoms, for example, stearic acid having 18 carbon atoms may also be contained.

Preferably, organic fatty acid-containing solution 31a which includes 5 mass % to 25 mass % of palmitic acid and an ester synthetic oil for the rest is used. By heating such organic fatty acid-containing solution 31a to each temperature in feeding section A and preheating section B for use, the organic fatty acid-containing solution 31a selectively incorporates impurities such as oxide and flux components present on a surface of copper electrode 2 of workpiece member 10, so that the surface of copper electrode 2 can be cleaned. Particularly preferably, organic fatty acid-containing solution 31a contains palmitic acid having 16 carbon atoms in an amount of around 10 mass % (for example, 5 mass % to 15 mass %). Furthermore, organic fatty acid-containing solution 31a does not contain metal salts such as nickel chloride or cobalt chloride and an additive such as an antioxidant.

If the organic fatty acid has a concentration of less than 5 mass %, an effect of selectively incorporating and purifying impurities such as oxide and flux components present on the surface of copper electrode 2 is slightly low, and also control of the incorporation and the purification of the impurities at low concentration can be complicated. On the other hand, if the concentration of the organic fatty acid is more than 25 mass %, there are problems such as an increased viscosity in organic fatty acid-containing solution 31a and the occurrence of fuming and odor in a high temperature range of 300° C. or higher. Accordingly, the content of the organic fatty acid is preferably 5 mass % to 20 mass %. Particularly, when using only palmitic acid having 16 carbon atoms, the content thereof is preferably around 10 mass % (for example, 5 mass % to 15 mass %).

Figure 4A:
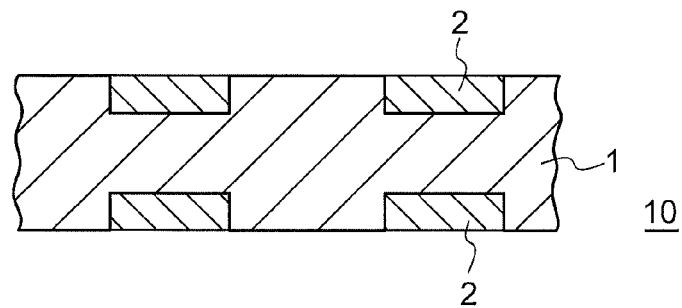
FIGS. 4A to 4D are schematic cross-sectional views illustrating a shape of the workpiece member, respectively, after having passed through each processing section or each step.
Figure 4B:
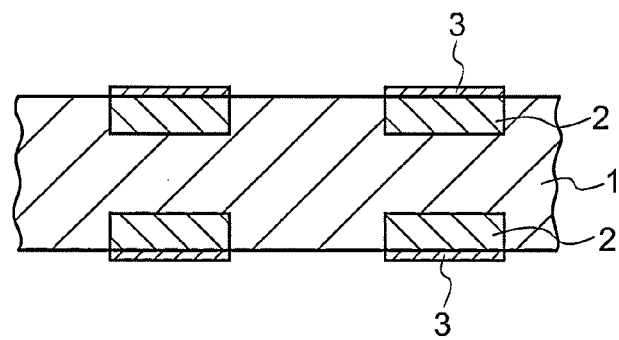

In first organic fatty acid-containing solution bath 21, workpiece member 10 fed in organic fatty acid-containing solution 31a described above is immersed, with the result that oxide and impurities present on the surface of copper electrode 2 of workpiece member 10 are removed for cleaning. Then, on the surface of copper electrode 2 is formed coating layer 3 (see FIG. 4(B)) of the organic fatty acid forming organic fatty acid-containing solution 31a. Coating layer 3 can clean the surface of copper electrode 2 and additionally can suppress the oxidation of the surface of copper electrode 2 in order to prevent the production of an oxidized coat film.

(Space Section)

As shown in FIG. 1 and FIG. 5, workpiece member 10 is processed in first organic fatty acid-containing solution bath 21 of feeding section A and preheating section B and then transferred to space section 24 as processing section C. Space section 24 is a space section having a pressurized steam atmosphere of organic fatty acid-containing solution 31b that is the same or roughly the same as organic fatty acid-containing solution 31a. The space section horizontally has ejection unit 33 that sprays jet stream 5' of molten solder 5a to copper electrode 2 provided on workpiece member 10 and ejection unit 34 that sprays a liquid to an excess of molten solder 5a for removal.

Space section 24 is preferably filled with a steam or the like of the organic fatty acid-containing solution and in a pressurized state. Pressure in space section 24 is not specifically limited, but is preferably around 0.1 Pa. Particularly, due to the state of the section pressurized in the above range by the steam of the organic fatty acid-containing solution, copper electrode 2 of workpiece member 10 is neither oxidized nor contaminated with any impurity. Space section 24 is formed as follows: after filling organic fatty acid-containing solution 31 up to an upper surface of space section 24, by first introducing nitrogen gas in order to lower the liquid surface of the organic fatty acid-containing solution so as to form space section 24 as shown in FIG. 1; and by subsequently heating of organic fatty acid-containing solution 31b in order to fill space section 24 with the steam thereof.

An atmospheric temperature of space section 24 is preferably the same temperature as that of molten solder 5a for soldering or a temperature close thereto. The atmospheric temperature thereof may be the same as that of molten solder 5a but is preferably set to be slightly higher than the temperature of molten solder 5a. For example, the atmospheric temperature thereof is preferably set to be 2° C. to 10° C. higher than a jet stream temperature of molten solder 5a, and more preferably set to be 2° C. to 5° C. higher than that thereof. By setting the atmospheric temperature of space section 24 within the above temperature range, jet stream 5' of molten solder 5a after having been ejected on the surface of copper electrode 2 can be uniformly flown on the surface of copper electrode 2. Particularly, molten solder 5a can be spread out to every corner of surfaces of copper electrodes with fine pitch and copper electrodes with small area. If the atmospheric temperature is lower than the jet stream temperature of molten solder 5a, viscosity of molten solder 5a is reduced and fluidity of molten solder 5a can be lowered. On the other hand, if the atmospheric temperature is set to be higher than 10° C., too high temperature can cause heat damage to workpiece member 10.

Under space section 24 is located organic fatty acid-containing solution bath 22, and space section 24 is filled with the steam of the organic fatty acid-containing solution evaporated from organic fatty acid-containing solution bath 22. Organic fatty acid-containing solution bath 22 is filled with a predetermined amount of organic fatty acid-containing solution 31b. The size and shape of organic fatty acid-containing solution bath 22 are not specifically limited. However, preferably, organic fatty acid-containing solution bath 22 has a size and a shape sufficient to allow organic fatty acid-containing solution 31b to be contained in an amount capable of generating a steam for setting the pressure of space section 24 to around 0.1 MPa. In the examples of FIG. 1 and FIG. 5, the bath is formed with a rectangular or cylindrical water tank structure just below space section 24.

The temperature of organic fatty acid-containing solution 31b is determined depending on the jet stream temperature of molten solder 5a, since the temperature of space section 24 is set to be the same or roughly the same as the jet stream temperature of molten solder 5a by the steam evaporated from organic fatty acid-containing solution 31b. For example, when the jet stream temperature of molten solder 5a is 250° C., the temperature of organic fatty acid-containing solution 31b is also preferably the same or roughly the same as that. By setting the temperature of the solution to the temperature as above, the temperature of the steam evaporated from organic fatty acid-containing solution 31b can be set to be the same or roughly the same as the jet stream temperature of molten solder 5a. As a means for controlling the temperature of organic fatty acid-containing solution 31b, a heater or a condenser may be wound around the circumference of organic fatty acid-containing solution bath 22, a heater or a condenser tube may be inserted in the bath, or organic fatty acid-containing solution 31b in the bath may be circulated through a piece of temperature regulation equipment (not shown) for the temperature control.

Preferably, organic fatty acid-containing solution 31b is a solution containing an organic fatty acid having 12 to 20 carbon atoms, as with organic fatty acid-containing solution 31a in first organic fatty acid-containing solution bath 21. Typically preferred is palmitic acid having 16 carbon atoms. It is particularly preferable to use only palmitic acid having 16 carbon atoms as the organic fatty acid. As needed, an organic fatty acid having 12 to 20 carbon atoms, such as stearic acid having 18 carbon atoms, may also be contained.

Preferably used organic fatty acid-containing solution 31b contains 5 mass % to 25 mass % of palmitic acid and an ester synthetic oil for the rest. By heating such organic fatty acid-containing solution 31b in organic fatty acid-containing solution bath 22 to use it as a steam generating source, the generated steam selectively incorporates impurities such as oxide and flux components present on the surface of copper electrode 2 of workpiece member 10, so that the surface of copper electrode 2 can be cleaned. Particularly preferred is organic fatty acid-containing solution 31b containing palmitic acid having 16 carbon atoms in the amount of around 10 mass % (for example, 5 mass % to 15 mass %). In addition, organic fatty acid-containing solution 31b contains neither metal salts such as nickel chloride or cobalt chloride nor an additive such as antioxidant. Upper and lower limits of concentration of the organic fatty acid are the same as those described regarding organic fatty acid-containing solution 31a, and thus an explanation thereof is omitted here.

(Ejection Processing of Molten Solder)

In space section 24 as processing section C, molten solder 5a is ejected to copper electrode 2 of workpiece member 10. The ejection processing is performed by ejection unit 33 for spraying jet stream 5' of molten solder 5a, and for example, ejection nozzle 33 as shown in FIG. 1 and FIG. 5 is preferably used.

First, a description will be given of molten solder 5a ejected from ejection nozzle 33. Solder used as molten solder 5a is one obtained by melting solder with heat and fluidizing it to an extent capable of being sprayed as jet stream 5'. Heating temperature is arbitrarily selected depending on solder composition. However, usually, a favorable temperature is determined from a range of about 150° C. to 300° C. The present invention uses a molten lead-free solder containing tin as a main component and at least nickel as an accessory component, as well as arbitrarily contains, as an accessory component, one or two or more selected from silver, copper, zinc, bismuth, antimony, and germanium.

A preferable solder composition is Sn—Ni—Ag—Cu—Ge alloy. Specifically, it is preferable to use a solder alloy containing 0.01 mass % to 0.5 mass % of nickel, 2 mass % to 4 mass % of silver, 0.1 mass % to 1 mass % of copper, 0.001 mass % to 0.02 mass % of germanium, and tin for the rest, in order to form Cu—Ni—Sn intermetallic layer 4 (see FIG. 8(B)) that can stably prevent copper erosion. A particularly preferable composition for forming such Cu—Ni—Sn intermetallic layer 4 is a solder alloy containing 0.01 mass % to 0.07 mass % of nickel, 0.1 mass % to 4 mass % of silver, 0.1 mass % to 1 mass % of copper, 0.001 mass % to 0.01 mass % of germanium, and tin for the rest. When soldering is performed using such an Sn—Ni—Ag—Cu—Ge alloy, the alloy is preferably used as molten solder 5a having a temperature of 240° C. to 260° C.

In addition, a bismuth-containing solder can further reduce the heating temperature of molten solder 5a and, for example, by the adjustment of a component composition of the solder, the temperature can be reduced down close to 150° C. Such temperature reduction is more preferable, since the temperature of steam in space section 24 can also be reduced. As with the above composition, the composition of bismuth-containing solder also preferably contains 0.01 mass % to 0.5 mass % of nickel, and more preferably contains 0.01 mass % to 0.07 mass % of nickel. In this manner, there can be prepared low-temperature type molten solder 5a that can easily form Cu—Ni—Sn intermetallic compound layer 4.

In addition, other zinc and antimony also are blended as needed. In any case, the solder composition contains at least nickel in the amount of preferably 0.01 mass % to 0.5 mass %, and more preferably 0.01 mass % to 0.07 mass %.

Figure 8A:
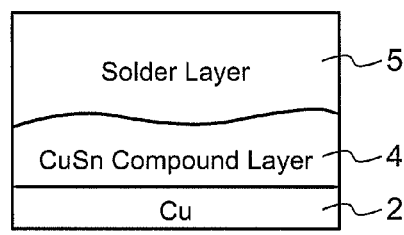
FIGS. 8A and 8B are examples of an intermetallic compound layer formed on a copper electrode.
Figure 8B:
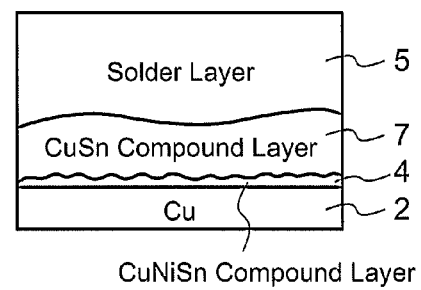

Molten solder 5a having such a composition is a lead-free solder that does not contain lead, as well as essentially contains the above content of nickel. Thus, as shown in FIG. 8(B), nickel contained in molten solder 5a combines with copper of copper electrode 2 and additionally combines with tin of molten solder 5a, so that Cu—Ni—Sn intermetallic compound layer 4 can be easily formed on the surface of copper electrode 2. Cu—Ni—Sn intermetallic compound layer 4 formed serves as a copper corrosion prevention layer of copper electrode 2 in order to prevent defects or dissipation of copper electrode 2. Accordingly, in subsequent steps, solder layer 5 having Cu—Ni—Sn intermetallic compound layer 4 can easily endure even a processing that can be hard for copper electrode 2, as in a case of feeding a substrate with solder layer 5 formed thereon in a dipping step for dipping in a solder bath. Therefore, even when performing a low cost solder dipping step, there can be formed highly reliable solder layer 5 with high yield. Furthermore, there can be obtained a mounting substrate, with high yield, which allows the mounting of an electronic component using solder layer 5 to be performed at low cost with high reliability.

A nickel content in molten solder 5a affects on a thickness of Cu—Ni—Sn intermetallic compound layer 4, as shown in an Example described later. Specifically, when the nickel content is in a range of 0.01 mass % to 0.5 mass % (preferably, 0.07 mass % or lower), there can be produced Cu—Ni—Sn intermetallic compound layer 4 with a roughly uniform thickness of about 1 µm to 3 µm. Cu—Ni—Sn intermetallic compound layer 4 having a thickness within the range can prevent copper in copper electrode 2 from dissolving into molten solder 5a or solder layer 5 to be corroded.

When the nickel content is 0.01 mass %, the thickness of Cu—Ni—Sn intermetallic compound layer 4 is about 1 μm to 1.5 μm. With the nickel content of, for example, 0.07 mass %, Cu—Ni—Sn intermetallic compound layer 4 has a thickness of about 2 μm, and with the nickel content of 0.5 mass %, Cu—Ni—Sn intermetallic compound layer 4 has a thickness of about 3 μm.

If the nickel content is less than 0.01 mass %, the thickness of Cu—Ni—Sn intermetallic compound layer 4 is less than 1 μm, which can cause a portion of copper electrode 2 to be unable to be covered by Cu—Ni—Sn intermetallic compound layer 4, easily causing copper corrosion from the portion. If the nickel content is more than 0.5 mass %, the thickness of hard Cu—Ni—Sn intermetallic compound layer 4 exceeds 3 μm to be larger, which can cause a crack in the Cu—Ni—Sn intermetallic compound layer 4. As a result, from the cracked part, copper corrosion easily occurs. A preferable nickel content is 0.01 mass % to 0.07 mass %. Molten solder 5a having a nickel content within the range is more unlikely to cause a crack in Cu—Ni—Sn intermetallic compound layer 4 than that having a nickel content more than 0.07 mass % and 0.5 mass % or less, and can form a smooth uniform layer.

Solder used as molten solder 5a is preferably one that has been subjected to purification processing. Specifically, a solution containing 5 mass % to 25 mass % of an organic fatty acid having 12 to 20 carbon atoms is heated to 180° C. to 350, and the heated solution is contacted with molten solder 5a to strongly stir and mix together. This allows the cleaning of molten solder 5a before purification processing, which has been contaminated with copper oxide, a flux component, and the like, so that there can be obtained molten solder 5a from which copper oxide, a flux component, and the like have been removed. After that, a mixture solution containing molten solder 5a from which copper oxide, a flux component, and the like have been removed is introduced in an organic fatty acid-containing solution bath (not shown). Then, molten solder 5a after cleaning, which has been separated by a specific gravity difference in the organic fatty acid-containing solution bath, is returned from a bottom of the organic fatty acid-containing solution bath to a lead-free solder liquid storage tank through a pump. Performing such a purification processing can suppress an increase with time in copper concentration and impurity concentration in molten solder 5a used as a jet stream, as well as can prevent the introduction of impurities such as copper oxide and a flux residue into the lead-free solder liquid storage tank. As a result, composition changes with time in molten solder 5a in the lead-free solder liquid storage tank can be suppressed, whereby solder layer 5 using molten solder 5a having stable and high joining reliability can be continuously formed. In addition, a mounting substrate provided with such solder layer 5 can be continuously produced.

Purified molten solder 5a does not contain impurities such as copper oxide and a flux residue affecting on the joining quality of solder layer 5. As a result, there occurs no lot-to-lot variation in the joining quality between solder layer 5 and an electronic component, which can contribute to chronological quality stabilization.

The organic fatty acid contained in the organic fatty acid-containing solution used for purification is the same as that contained in organic fatty acid-containing solutions 31a and 31b described above. Thus, an explanation thereof is omitted here. The temperature of the organic fatty acid-containing solution used for purification is determined by a melting point of molten solder 5a to be purified, and the organic fatty acid-containing solution and molten solder 5a are strongly stirred to be contacted with each other at a high temperature range of at least the melting point of molten solder 5a or higher (as one example, 240° C. to 260° C.). In addition, An upper limit temperature of the organic fatty acid-containing solution is about 350° C. from the viewpoint of a fuming problem and energy saving, and is desirably within a range of from a temperature, which is equal to or higher than the melting point of molten solder 5a to be subjected to purification processing, to 300° C. For example, since the solder alloy containing 0.01 mass % to 0.07 mass % of nickel, 0.1 mass % to 4 mass % of silver, 0.1 mass % to 1 mass % of copper, 0.001 mass % to 0.01 mass % of germanium, and tin for the rest is used as molten solder 5a at the temperature of 240° C. to 260° C., the temperature of the organic fatty acid-containing solution also is preferably the same as that, about 240° C. to 260° C.

Figure 6:
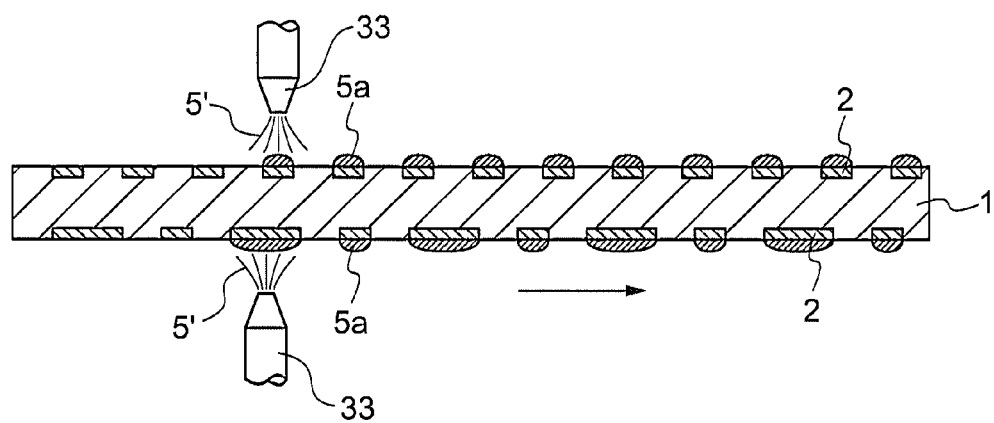
FIG. 6 is a schematic cross-sectional view illustrating a step of ejecting a molten solder to pile up the molten solder on a copper electrode.

Molten solder 5a purified by such an organic fatty acid-containing solution is, as shown in FIG. 1 and FIG. 6, sprayed as jet stream 5' from ejection unit 33 to workpiece member 10. Ejection pressure of molten solder 5a from ejection unit 33 is not specifically limited and arbitrarily set according to the kind, temperature, viscosity, and the like of molten solder 5a. Usually, molten solder 5a is ejected at a pressure of about 0.3 MPa to 0.8 MPa. The preferable atmospheric temperature is, as described above, a temperature that is the same or roughly the same as (preferably, slightly higher than) the jet stream temperature of molten solder 5a. In this manner, as shown in FIG. 4 and FIG. 6, swollen molten solder 5a is formed. Additionally, flow speed and spraying time of jet stream 5' of molten solder 5a sprayed from ejection unit 33 are arbitrarily set based on the kind and the like of molten solder 5a. In addition, conditions such as the shape and spraying angle of ejection unit 33, are also arbitrarily formed or set based on the kind and the like of molten solder 5a.

(Removal Processing of Excess Molten Solder)

Figure 4C:
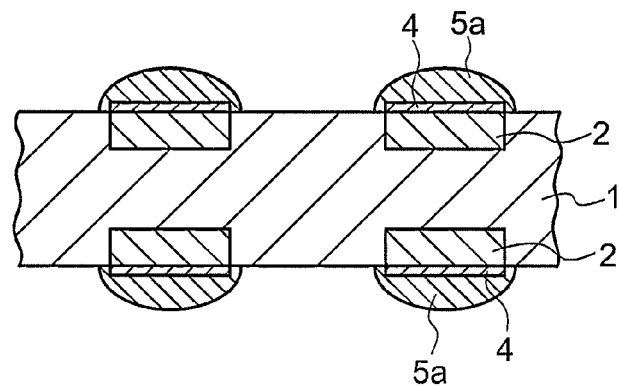
Figure 4D:
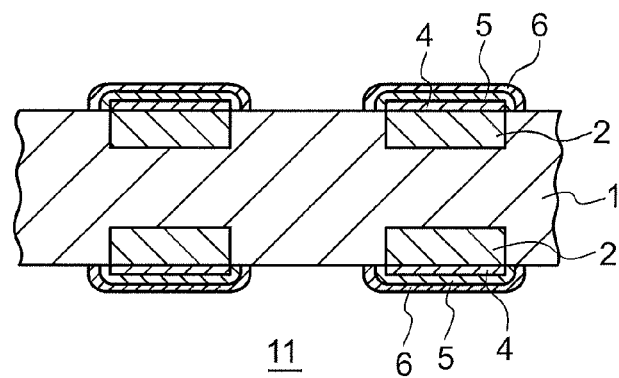
Figure 7:
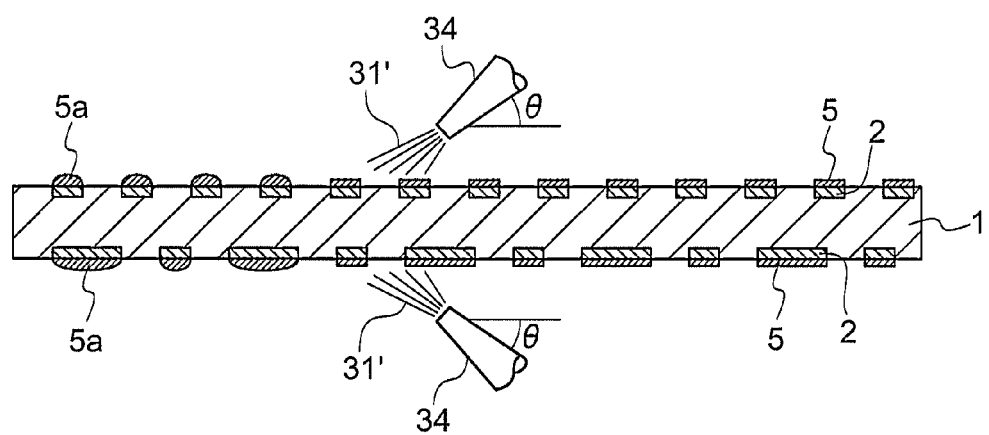
FIG. 7 is a schematic cross-sectional view illustrating a step of removing an excess molten solder by ejecting an organic fatty acid-containing solution.

As shown in FIG. 6, workpiece member 10 with swollen molten solder 5a is horizontally transferred in space section 24 as processing section C to shift to a step of spraying a liquid to an excess of molten solder 5a for removal. Such a step of removing excess molten solder 5a is a step of removing molten solder 5a swollen on copper electrode 2 as shown in FIG. 4(C) and FIG. 7 and leaving only molten solder 5a that cannot be removed. Molten solder 5a incapable of being removed means molten solder 5a adhered to Cu—Ni—Sn intermetallic compound layer 4 formed on copper electrode 2, and the adhered molten solder 5a forms solder layer 5.

The liquid for removing molten solder 5a is not specifically limited as long as it is a liquid. However, since space section 24 is under the steam atmosphere of the organic fatty acid-containing solution, the organic fatty acid-containing solution is used. In addition, an inert gas such as nitrogen gas may be partially mixed, but air, water, and the like containing oxygen are not allowed to be mixed from the viewpoint of oxidation of solder layer 5 and compatibility into the organic fatty acid-containing solution. Ejection pressure of the liquid from ejection unit 33 is not specifically limited and arbitrarily set according to the kind, temperature, viscosity, and the like of molten solder 5a. Usually, the liquid is ejected at a pressure of about 0.2 MPa to 0.4 MPa.

The organic fatty acid-containing solution used as the ejected liquid is preferably the same as organic fatty acid-containing solution 31b in organic fatty acid-containing solution bath 22. The liquid to be used is a liquid heated such that the temperature of organic fatty acid-containing solution 31b is the same or roughly the same as that of molten solder 5a (for example, around 250° C.). In this manner, excess molten solder 5a is blown off, and simultaneously, organic fatty acid coating layer 6 (see FIG. 10(B)) can be formed on an exposed surface of molten solder 5a.

(Reuse of Molten Solder)

Below ejection unit 33 in space section 24 may be provided tray 37 for collecting ejected molten solder 5a for reuse, as shown in FIG. 1. In addition, as shown in FIG. 5, there may be provided circulation device 37a for sending molten solder 5a deposited at the bottom of organic fatty acid-containing solution 31b to ejection unit 33 for spraying molten solder 5a.

Similarly, also under ejection unit 34 in space section 24, as shown in FIG. 1, there may be provided tray 38 for collecting molten solder 5a removed by removal of excess molten solder for reuse. Additionally, there may be provided circulation device 37a for sending molten solder 5a to ejection unit 33 for spraying molten solder 5a, as shown in FIG. 5, also in a case in which molten solder 5a removed by the removal of excess molten solder drops below and is deposited at the bottom of organic fatty acid-containing solution 31b below.

In addition, the ejected organic fatty acid-containing solution and molten solder 5a removed together with the organic fatty acid-containing solution can be separated by a specific gravity difference, and molten solder 5a sank at the bottom of the organic fatty acid-containing solution can be taken out to be separated from the organic fatty acid-containing solution. Separated molten solder 5a and the organic fatty acid-containing solution can be reused.

(Immersion Processing in Second Organic Fatty Acid-Containing Solution)

Workpiece member 10 after the removal of excess molten solder 5a is conveyed to second organic fatty acid-containing solution bath 23 including refeeding section D and cooling section E, from space section 24 as processing section C in order to be immersed again in second organic fatty acid-containing solution 31c in second organic fatty acid-containing solution bath 23. Second organic fatty acid-containing solution bath 23 is composed of refeeding section D having high temperature and cooling section E positioned at a step farther downstream from refeeding section D and having low temperature.

Refeeding section D is, for example, as shown in FIG. 1 and FIG. 5, of a rectangular or cylindrical water tank structure extending diagonally from upward to downward and is a region where workpiece member 10 processed in processing section C is again fed in organic fatty acid-containing solution 31c. In refeeding section D, the temperature of organic fatty acid-containing solution 31c is preferably controlled to be the same as that of preheating section B described above. That is, in refeeding section D, organic fatty acid-containing solution 31c in second organic fatty acid-containing solution bath 23 is preferably controlled to be at a relatively high temperature, for example, about 100° C. to 240. As a control means for that, a heater or a condenser may be wound around the circumference of refeeding section D for the control, or a heater or a condenser tube may be inserted in the bath of refeeding section D for the control. A preferable temperature is about 140° C. to 220° C. Setting the temperature of the solution within such a temperature range can prevent rapid cooling of workpiece member 10 conveyed out from space section 24 controlled to the temperature atmosphere of around about 250° C., allowing the prevention of occurrence of defects or the like due to rapid thermal contraction or the like. In addition, in refeeding section D, since second organic fatty acid-containing solution bath 23 and space section 24 are continued, there is an advantage that the evaporation of organic fatty acid-containing solution 31c is no consideration.

Organic fatty acid-containing solution 31c is contained in second organic fatty acid-containing solution bath 23. Organic fatty acid-containing solution 31c is preferably the same as organic fatty acid-containing solutions 31a and 31b already described above, and an explanation thereof is omitted here. Alternatively, organic fatty acid-containing solution 31c may be made into organic fatty acid-containing solution 31c different from organic fatty acid-containing solutions 31a and 31b already described above in order to have a slightly different composition. The reason is that organic fatty acid-containing solutions 31a and 31b already described both directly act on the surface of copper electrode 2 in order to perform the cleaning of the copper electrode surface and the cleaning of molten solder 5a. However, organic fatty acid-containing solution 31c is used in refeeding section D positioned after copper corrosion prevention layer 4 and solder layer 5 have already been formed. Accordingly, unlike organic fatty acid-containing solutions 31a and 31b preferably using only palmitic acid having 16 carbon atoms as the organic fatty acid, organic fatty acid-containing solution 31c may be a solution containing an organic fatty acid having 12 to 20 carbon atoms.

Cooling section E is, for example as shown in FIG. 1 and FIG. 5, arranged following refeeding section D in second organic fatty acid-containing solution bath 23. Cooling section E is of a rectangular or cylindrical water tank structure extending from downward to upward and is a region where processed member 11 processed in refeeding section D is cooled down in organic fatty acid-containing solution 31c having a further lower temperature. In the cooling section E, the temperature of organic fatty acid-containing solution 31c is preferably controlled to be the same as that of feeding section A described above.

Specifically, in cooling section E, organic fatty acid-containing solution 31c in second organic fatty acid-containing solution bath 23 is preferably controlled to a not-so high temperature, for example, about 30° C. to 100° C. As a control means for that, a heater or a condenser may be wound around the circumference of the bath of cooling section E for the control, or a heater or a condenser tube may be inserted in the bath of cooling section E for the control. A preferable temperature is about 30° C. to 60° C. Setting the temperature of the solution within such a not-too high temperature range can suppress the evaporation of organic fatty acid-containing solution 31c, as well as can prevent the occurrence of thermal contraction-induced defects or the like due to sudden exposure of processed member 11 at high temperature to outside air at room temperature.

(Subsequent Steps)

After immersion processing in second organic fatty acid-containing solution bath 23, as shown in FIG. 1 and FIG. 5, organic fatty acid-containing solution 31c adhered to the surface of processed member 11 after the immersion processing is drained off. The removal of the draining off is performed preferably by ejection unit 39 such as an air nozzle. An ejection pressure of ejection unit 39 at that time is not specifically limited and arbitrarily set according to the size and shape of processed member 11. In this manner, there can be obtained processed member 11 processed by all of the above processes.

When processed member 11 obtained by the above processes is a substrate such as a printed circuit board, on the surface of copper electrode 2 of the substrate are provided copper corrosion prevention layer 4, minimum solder layer 5, and organic fatty acid coating layer 6 in this order. As a result, in a mounting step of the substrate, even when the substrate is dipped in various molten solder baths, fed in a reflow furnace after printing of paste solder, or fed in a combustion furnace, there occurs no copper erosion of copper electrode 2, and also, without deterioration of solder wettability, the substrate can be processed subsequently in mounting steps.

Even when processed member 11 obtained is an electronic component, on the surface of copper electrode 2 of the electronic component are provided copper corrosion prevention layer 4, minimum solder layer 5, and organic fatty acid coating layer 6 in this order. As a result, in a mounting step of the electronic component, even when dipped in various molten solder baths, fed in a reflow furnace after placed on a printed paste solder, or fed in a combustion furnace, there occurs no copper erosion of copper electrode 2 of the electronic component, and also, without deterioration of solder wettability, the electronic component can be processed subsequently in mounting steps.

As described hereinabove, soldering device 20 and soldering method according to the present invention perform continuously immersion processing in first organic fatty acid-containing solution 31a, ejection processing of molten solder 5a in space section 24, removal processing of excess molten solder 5a performed by horizontal transfer in space section 24, and immersion processing in second organic fatty acid-containing solution 31c. Accordingly, there can be obtained a substrate and an electronic component in which there occurs no copper corrosion of copper electrodes, as occurring in conventional dipping processing, and no copper corrosion occurs in subsequent various mounting steps. As a result, there can be produced, at low cost, a substrate and an electronic component that achieve high reliability on copper electrode 2 as an electrical joint and have high yield.

Particularly, after immersion in organic fatty acid-containing solution 31a, in space section 24 under the steam atmosphere of organic fatty acid-containing solution 31b that is the same or roughly the same as organic fatty acid-containing solution 31a, jet stream 5' of molten solder 5a is sprayed to copper electrode 2 provided on workpiece member 10. Additionally, after workpiece member 10 is horizontally transferred in space section 24, liquid 31' is sprayed to excess molten solder 5a of workpiece member 10 to remove the solder. Therefore, on the cleaned surface of copper electrode 2 is formed copper corrosion prevention layer 4 uniformly without any defect, as well as workpiece member 10 is immersed again in organic fatty acid-containing solution 31c in the state in which excess molten solder 5a has been removed, so as to provide organic fatty acid coating layer 6. As a result, there is provided organic fatty acid coating layer 6 maintaining solder wettability of solder layer 5 in a state in which minimum solder layer 5 has been provided on copper corrosion prevention layer 4. Thus, in subsequent mounting steps, even when dipped in various molten solder baths, fed in a reflow furnace after printing of paste solder, or fed in a combustion furnace, there occurs no copper erosion of copper electrode, and also, without deterioration of solder wettability, the member can be processed subsequently in mounting steps.

[Produced Substrate and Electronic Component]

Figure 3:
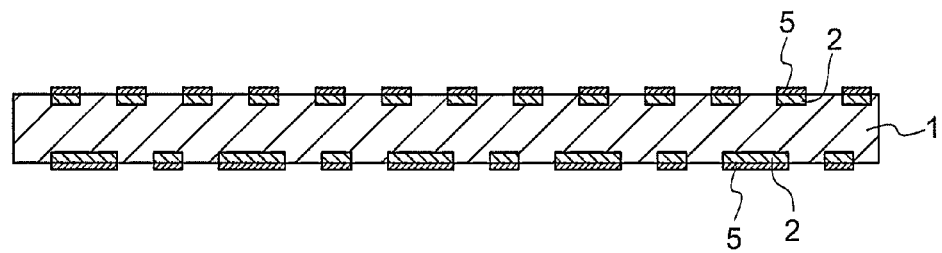
FIG. 3 is a schematic cross-sectional view illustrating one example of a substrate that has been processed (post-processed member).

Substrate 10 according to the present invention is, as shown in FIG. 3, a substrate produced by soldering device 20 or the soldering method according the present invention described above. On copper electrode 2 provided on substrate 10, copper corrosion prevention layer 4, minimum solder layer 5, and organic fatty acid coating layer 6 are provided in this order from the surface of copper electrode 2. Examples of substrate 10 include various substrates such as a printed circuit board, a wafer, and a flexible substrate. Particularly, since electrode width and pitch of wafers are narrow, it is preferable to use the device and the method according to the present invention, whereby solder layer 5 can be provided with high precision on microelectrodes arranged at narrow pitch. In addition, even in the cases of printed circuit boards and flexible substrates adapted to be provided with large electronic components thereon, the surface of solder layer 5 can be maintained in a cleaned state or can be processed in a later step, so that those substrates can be used as reliable ones.

Figure 10A:
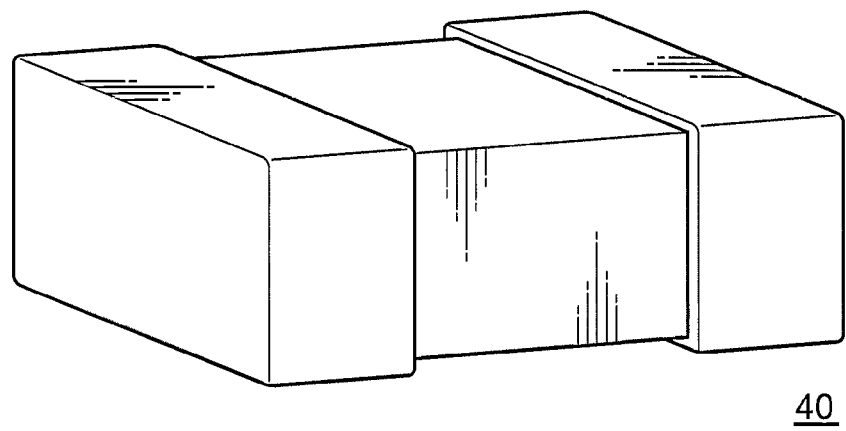
FIGS. 10A and 10B are a perspective view and a cross-sectional view illustrating one example of a produced electronic component.
Figure 10B:
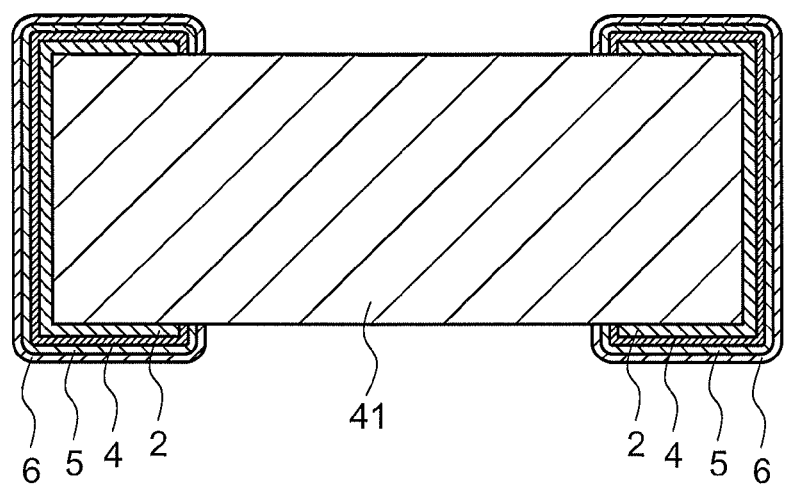
Figure 11A:
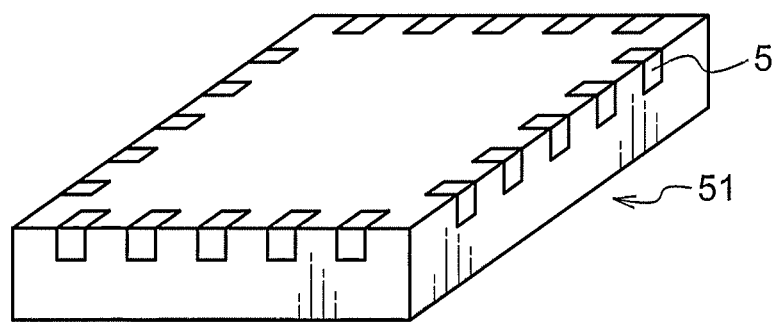
FIGS. 11A and 11B are perspective views illustrating other examples of produced electronic components.
Figure 11B:
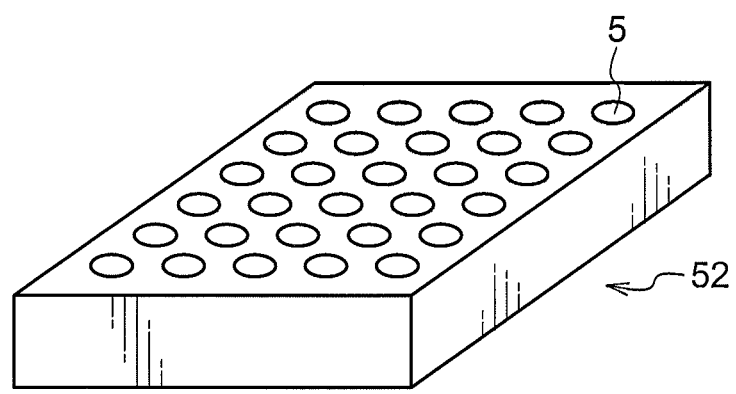

In addition, as shown in FIG. 10 and FIG. 11, an electronic component according to the present invention is electronic component 40, 51 or 52 produced by the soldering device 20 or the soldering method according to the present invention described above. On copper electrode 2 provided on electronic component 40, 51 or 52, copper corrosion prevention layer 4, minimum solder layer 5, and organic fatty acid coating layer 6 are provided in this order from the surface of copper electrode 2. Examples of the electronic component include a semiconductor chip, a semiconductor module, an IC chip, an IC module, a dielectric chip, a dielectric module, a resistor chip, and a resistor module.

According to the substrate and the electronic component thus formed, even when heat is applied in a reflow furnace, a combustion furnace, or the like after that, copper corrosion prevention layer 4 blocks copper corrosion of copper electrode 2. As a result of that, reliability on electrical joints (copper electrode portions) in an electronic component mounting step performed through various steps is not deteriorated, and the electronic component can be produced with high yield. Therefore, highly reliable substrates and electronic components can be provided at low cost.

EXAMPLES

Hereinafter, the present invention will be described in more detail with reference to an Example and a Comparative Example.

Example 1

Figure 2:
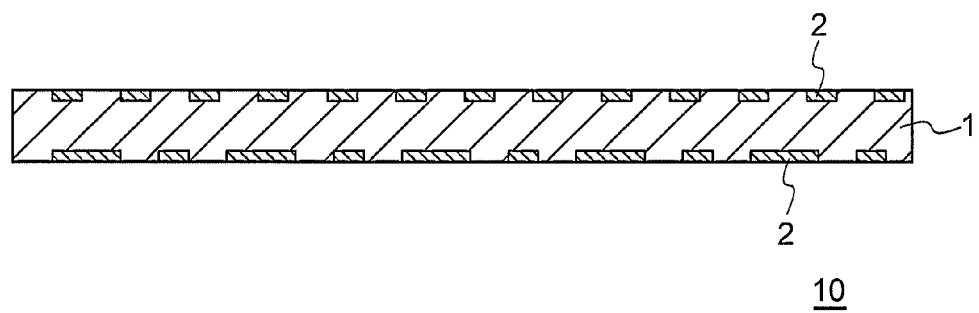
FIG. 2 is a schematic cross-sectional view illustrating one example of a substrate as a workpiece member.

As one example, substrate 10 was prepared by forming a pattern of copper wires having a width of 200 μm and a thickness of 10 μm on substrate 1 (for example, see FIG. 2). On this substrate 10, only copper electrodes 2 of the copper wire pattern having the width of 200 μm and a length of 50 μm, which serve as a mounting portion of an electronic component, are exposed in great numbers, and the other copper wires of the pattern are covered with an insulation layer.

As organic fatty acid-containing solution 31a, 31b or 31c of each section shown in FIG. 1, an organic fatty acid-containing solution was prepared by including palmitic acid up to an amount of 10 mass % in an ester synthetic oil that does not contain metal salts such as nickel chloride and cobalt chloride, an antioxidant, and the like. The temperature of organic fatty acid-containing solution 31a of feeding section A was controlled to 50° C.; the temperature of organic fatty acid-containing solution 31a of preheating section B was controlled to 200° C.; the temperature of organic fatty acid-containing solution 31b of processing section C was controlled to 250° C.; the temperature of organic fatty acid-containing solution 31c of refeeding section D was controlled to 200° C.; and the temperature of organic fatty acid-containing solution 31c of cooling section E was controlled to 50° C.

Molten solder 5a used was a quinary lead-free solder consisting of Ni: 0.05 mass %, Ge: 0.005 mass %, Ag: 3 mass %, Cu: 0.5 mass %, and Sn for the rest. The quinary lead-free solder was heated to 250° C. to prepare as molten solder 5a.

Space section 24 was first filled with the organic fatty acid-containing solution up to the top surface thereof, and then, nitrogen gas was introduced to form an upper space. In that state, the temperature of organic fatty acid-containing solution 31b was increased up to 250° C. to fill the upper space with a steam of organic fatty acid-containing solution 31b. Into soldering device 20 thus prepared, substrate 10 was fed.

While substrate 10 shown in FIG. 2(A) was being conveyed to pass through feeding section A and preheating section B, organic fatty acid coating layer 3 was adhered onto the surface of copper electrode 2. Organic fatty acid coating layer 3 is adhered as the result of cleaning of the copper surface by organic fatty acid-containing solution 31a. Substrate 10 was placed in processing section C after passing through preheating section B, and as shown in FIG. 6, jet stream 5' of molten solder 5a, for example, at 250° C., was ejected from ejection nozzles 33 set towards upper and lower surfaces of substrate 10. On copper electrode 2 where molten solder 5a has been sprayed, molten solder 5a was formed into a swollen shape, as shown in FIG. 4(C). Sequentially, as shown in FIG. 7, onto both the upper and lower surfaces of substrate 10, organic fatty acid-containing solution 31a, for example, at 250° C. was ejected from ejection nozzles 34 both set at an inclination of, for example, 30 degrees (see FIG. 7). As a result of that, there was obtained a substrate having a configuration shown in FIG. 4(D). On solder layer 5 of this substrate 11 is provided organic fatty acid coating layer 6. After that, substrate 11 was conveyed continuously to refeeding section D and cooling section E, and in cooling section E, immediately after the substrate was conveyed out from organic fatty acid-containing solution 31c, the solution was drained off by air ejection from an air nozzle, thereby obtaining a substrate 11.

Figure 12A:
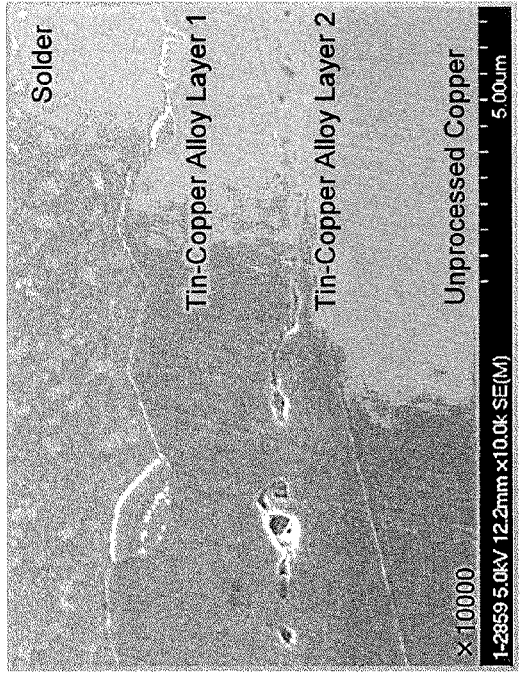
FIGS. 12A to 12D are examples of forms of micro voids occurred after heating of a soldered copper electrode portion.
Figure 12B:
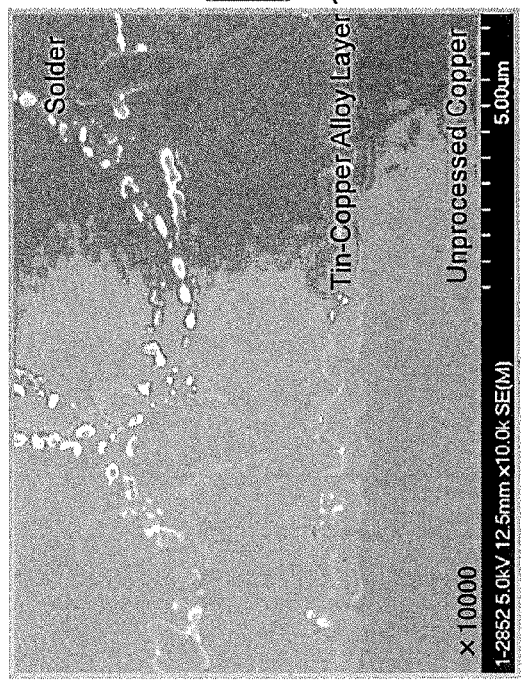
Figure 12D:
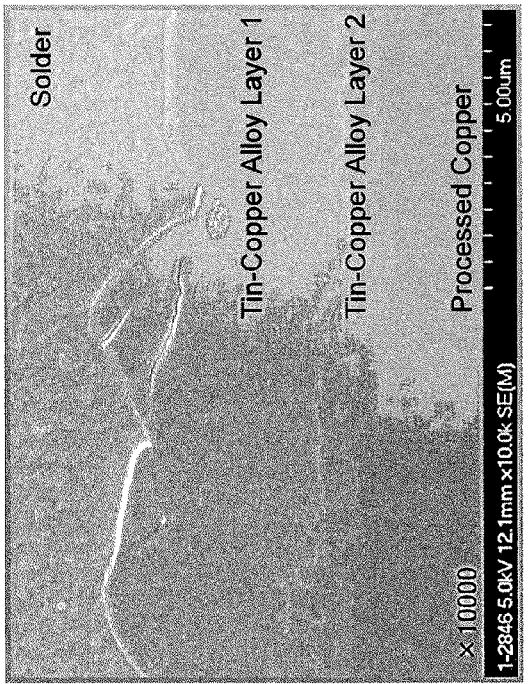
Figure 12C:
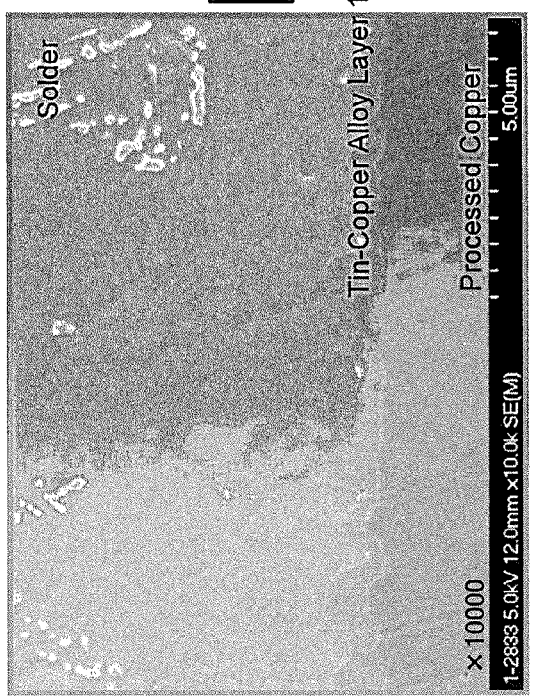
Figure 13A:
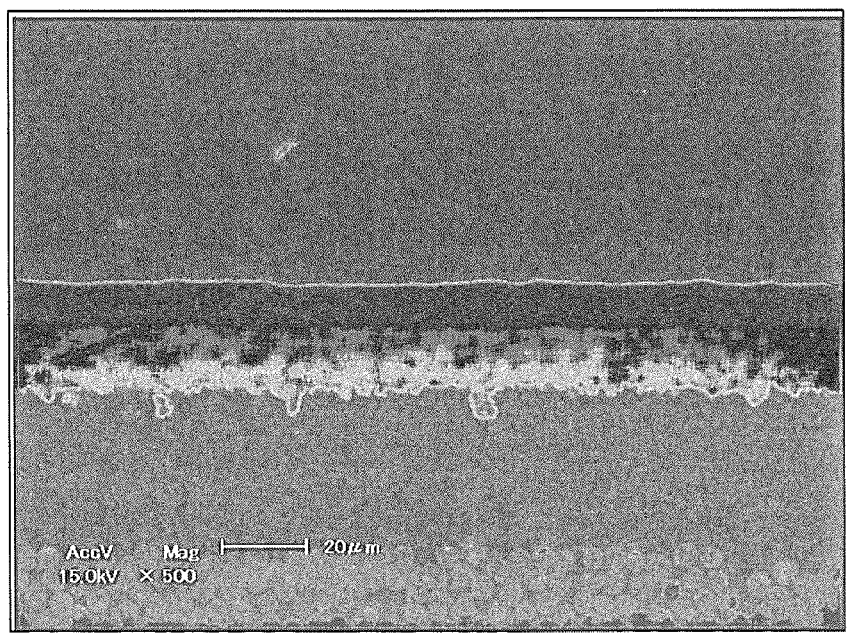
FIGS. 13A and 13B are element-mapping images of a solder joint portion obtained in the Example.
Figure 13B:
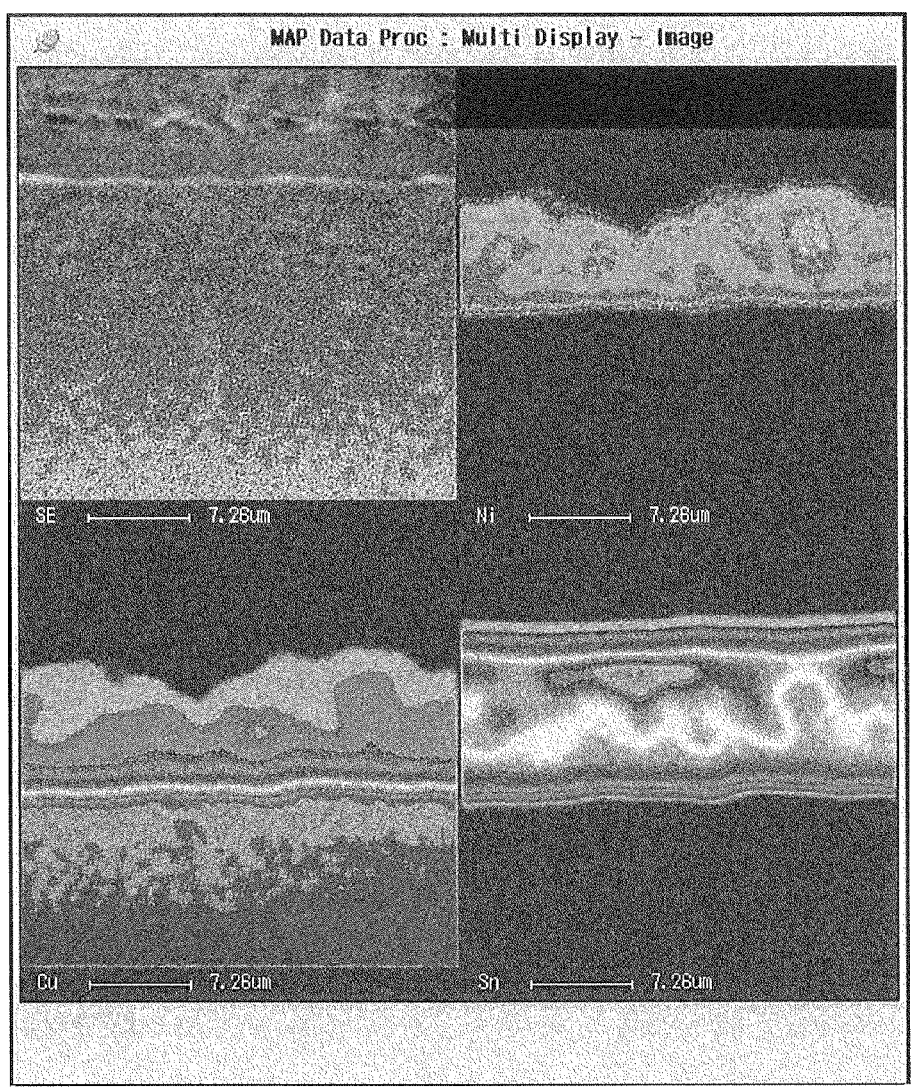

A scanning electron micrographic configuration of a cross-section of solder layer 5 of substrate 11 obtained is shown in FIG. 12(C). From the cross-sectional photograph, a thickness of Cu—Ni—Sn intermetallic compound layer 4 is measured by a scanning electron micrograph to find that the layer was uniformly formed with a thickness of 1.5 μm. In addition, FIG. 12(D) is a scanning electron micrographic configuration of a cross section of solder layer 5 after aging for 240 hours at 150° C. There were no defects such as voids. Furthermore, the cross-section was evaluated by element mapping of an X-ray micro analyzer (EPMA) and shown in FIG. 13.

Comparative Example 1

A substrate according to Comparative Example 1 was obtained in the same manner as in Example 1 except for using, as a solder material, a ternary lead-free solder consisting of Ag: 3 mass %, Cu: 0.5 mass %, and Sn for the rest. As with Example 1, from a scanning electron micrograph of a cross-section, there was no Cu—Ni—Sn intermetallic compound layer (see FIG. 12(A)), and on copper electrode 2 was formed Cu—Sn intermetallic compound layer 13b. In addition, FIG. 12(B) is a scanning electron micrographic configuration of a cross-section of solder layer 5 after aging for 240 hours at 150° C., in which a defect such as a void was found.

DESCRIPTION OF THE REFERENCE NUMERALS

1 Substrate
2 Copper electrode
3 Coating layer
4 Copper corrosion prevention layer
5 Solder layer
5' Jet stream
5a Molten solder
6 Organic fatty acid coating layer
7 Cu—Sn compound layer
10 Workpiece member (substrate or electronic component)
11 Processed member
20 Soldering device
21 First organic fatty acid-containing solution bath
22 Organic fatty acid-containing solution bath
23 Second organic fatty acid-containing solution bath
27 Space section
31, 31a, 31b, 31c Organic fatty acid-containing solution
31' Sprayed liquid of the organic fatty acid-containing solution
32 Steam atmosphere of the organic fatty acid-containing solution
33 Ejection unit (ejection nozzle of molten solders)
34 Ejection unit (ejection nozzle of the organic fatty acid-containing solutions)
35 Feeding path of the molten solder
36 Feeding path of the organic fatty acid-containing solution
37, 38 Tray for collecting the molten solder
37a Circulation device for sending molten solder
39 Ejection unit (Removal unit for removal of excess organic fatty acid-containing solutions)
40 Electronic component
41 Element
42 Support jig of an electronic component
51, 52 Semiconductor chip
A Feeding section
B Preheating section
C Processing section
D Refeeding section
E Cooling section

The invention claimed is:

1. A soldering device, comprising:
a first organic fatty acid-containing solution bath in which a workpiece member having a copper electrode is immersed in an organic fatty acid-containing solution;
a space section having a steam atmosphere of an organic fatty acid-containing solution, the space section horizontally comprising an ejection unit to spray a jet stream of a molten solder to the copper electrode provided on the workpiece member and an ejection unit to spray a liquid to an excess of the molten solder for removal; and
a second organic fatty acid-containing solution bath in which the workpiece member from which the excess of the molten solder is removed in the space section is immersed again in the organic fatty acid-containing solution.

2. The soldering device according to claim 1, wherein the organic fatty acid-containing solution is a palmitic acid-containing solution.

3. The soldering device according to claim 1, wherein the molten solder is a molten solder processed with the organic fatty acid-containing solution.

4. The soldering device according to claim 1, wherein the liquid for removing the excess of the molten solder is the organic fatty acid-containing solution.

5. The soldering device according to claim 1, further comprising, after the processing in the second organic fatty acid-containing solution bath, an ejection unit that drains off the organic fatty acid-containing solution adhered to a surface of the workpiece member.

6. The soldering device according to claim 1, wherein temperatures of the first organic fatty acid-containing solution bath and the second organic fatty acid-containing solution bath are lower than a temperature of the space section, and the temperature of the space section is the same as or higher than a temperature of the molten solder sprayed in the space section.

7. The soldering device according to claim 1, further comprising a tray that collects the molten solder sprayed to the workpiece member for reuse, the tray being provided below the ejection unit in the space section.

8. The soldering device according to claim 1, further comprising a circulation device that provide the molten solder deposited at the bottom of the organic fatty acid-containing solution below the ejection unit to the ejection unit for spraying the molten solder.

9. A soldering method, comprising:
   an immersion step of immersing a workpiece member having a copper electrode in an organic fatty acid-containing solution;
   a spraying step of spraying an jet stream of a molten solder to the copper electrode provided on the workpiece member in a space section having a steam atmosphere of an organic fatty acid-containing solution, after the immersion step;
   a transferring step of horizontally transferring the workpiece member after the spraying step and spraying a liquid to an excess molten solder of the sprayed molten solder for removal; and
   a re-immersing step of immersing the workpiece member from which the excess molten solder is removed in the transferring step, again in an organic fatty acid-containing solution.

* * * * *